（12） United States Patent
Kim et al.

(10) Patent No.: US 6,376,323 B1
(45) Date of Patent: Apr. 23, 2002

(54) FABRICATION OF GATE OF P-CHANNEL FIELD EFFECT TRANSISTOR WITH ADDED IMPLANTATION BEFORE PATTERNING OF THE GATE

(75) Inventors: Hyeon-Seag Kim, San Jose; Joong Jeon, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/825,819

(22) Filed: Apr. 4, 2001

(51) Int. Cl.[7] .............................................. H01L 21/331
(52) U.S. Cl. ....................................... 438/373; 438/306
(58) Field of Search ................................. 438/302, 306, 438/373, 515, 525, 528, 589, 153, 155, 158, 232, 275, 527

(56) References Cited

U.S. PATENT DOCUMENTS

| | | | | |
|---|---|---|---|---|
| 5,563,093 A | * | 10/1996 | Koda et al. | 438/231 |
| 5,739,440 A | * | 4/1998 | Manning | 438/232 |
| 6,049,107 A | * | 4/2000 | Peidous | 257/336 |
| 6,097,453 A | * | 8/2000 | Okita | 349/43 |
| 6,214,679 B1 | * | 4/2001 | Murthy et al. | 438/299 |
| 6,288,432 B1 | * | 9/2001 | Hause et al. | 257/408 |

* cited by examiner

Primary Examiner—David Nelms
Assistant Examiner—Phuc T. Dang

(74) Attorney, Agent, or Firm—Monica H. Choi

(57) ABSTRACT

For fabricating a PMOS (P-channel Metal Oxide Semiconductor) field effect transistor on a semiconductor substrate, a layer of gate dielectric material containing nitrogen is deposited on the semiconductor substrate, and a layer of gate electrode material is deposited on the layer of gate dielectric material. A first P-type dopant, such as boron for example, is implanted into a first region of the layer of gate electrode material disposed over a first active device area of the semiconductor substrate. The first region of the layer of gate electrode material is patterned to form a PMOS gate electrode. The layer of gate dielectric material is patterned to form a PMOS gate dielectric disposed under the PMOS gate electrode. A second P-type dopant, such as boron fluoride ($BF_2$) for example, is implanted into the PMOS gate electrode and into the exposed regions of the first active device area of the semiconductor substrate to form a drain extension junction and a source extension junction of the PMOS field effect transistor. The boron as the first P-type dopant is a lighter dopant than boron fluoride ($BF_2$) and thus distributes more evenly throughout the layer of gate electrode material. The nitrogen within the gate dielectric material below the layer of gate electrode material prevents diffusion of the boron out of the gate electrode material and into the gate dielectric. Thus, a depletion region is less likely to form toward the bottom of the gate electrode near the gate dielectric. The boron fluoride ($BF_2$) as the second P-type dopant that is relatively heavier is used to form shallow drain and source extensions to minimize short channel effects of the PMOS field effect transistor.

18 Claims, 4 Drawing Sheets

US 6,376,323 B1

FABRICATION OF GATE OF P-CHANNEL FIELD EFFECT TRANSISTOR WITH ADDED IMPLANTATION BEFORE PATTERNING OF THE GATE

TECHNICAL FIELD

The present invention relates generally to fabrication of field effect transistors having scaled-down dimensions, and more particularly, to a process for fabricating a P-channel field effect transistor having a doped gate electrode with an added implantation of boron before patterning of the gate electrode and with a nitrided gate dielectric to minimize boron diffusion into the gate dielectric such that a thick gate electrode with minimized depletion region may be formed even with shallow drain and source extensions.

BACKGROUND OF THE INVENTION

A long-recognized important objective in the constant advancement of is monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

As the dimensions of the MOSFET 100 are scaled down to tens of nanometers, short-channel effects degrade the performance of the MOSFET 100. Short-channel effects that result due to the short length of the channel between the drain extension 104 and the source extension 106 of the MOSFET 100 are known to one of ordinary skill in the art of integrated circuit fabrication. The electrical characteristics of the MOSFET 100 become difficult to control with bias on the gate electrode 118 with short-channel effects which may severely degrade the performance of the MOSFET.

As the dimensions of the MOSFET 100 are further scaled down to tens of nanometers, short channel effects are more likely to disadvantageously affect the operation of the MOSFET 100, as known to one of ordinary skill in the art of integrated circuit fabrication. Referring to FIG. 1, to prevent short channel effects, the drain and source extension junctions 104 and 106 are formed to be as shallow as possible, as known to one of ordinary skill in the art of integrated circuit fabrication.

Referring to FIG. 2, in the prior art, the drain and source extension junctions 104 and 106 are formed by implantation of a P-type dopant when the MOSFET 100 is a PMOSFET (P-channel Metal Oxide Semiconductor Field Effect Transistor). A relatively heavy P-type dopant such as boron fluoride ($BF_2$) is implanted such that the drain and source extension junctions 104 and 106 are shallow to minimize short channel effects. The gate electrode 118 that is comprised of a semiconductor material such as polysilicon is also doped with the boron fluoride ($BF_2$) during such an implantation process. However, because the parameters in the implantation process are designed for forming the drain and source extension junctions 104 and 106 that are shallow, the boron fluoride ($BF_2$) dopant may not extend down into the gate electrode 118 toward the gate dielectric 116. The gate electrode 118 is desired to have a relatively large height such that a thick silicide may be formed with the gate electrode 118 to minimize resistance at the gate of the MOSFET 100. With minimized P-type dopant near the gate dielectric 116, a depletion region 130 forms toward the bottom of the gate electrode 118 near gate dielectric 116. Such a depletion region 130 is disadvantageous because such a depletion region increases the effective gate capacitance to degrade the speed performance of the MOSFET 100. In addition, such a depletion region 130 disadvantageously increases the threshold voltage of the MOSFET 100.

Furthermore, the gate dielectric 116 is comprised of silicon dioxide ($SiO_2$) in the prior art, and such as gate dielectric 116 draws the P-type dopant away from the gate electrode 118 and into the gate dielectric 116. Thus, the disadvantageous depletion region 130 is more likely to be formed when the gate dielectric is comprised of silicon dioxide ($SiO_2$).

For increasing the concentration of the P-type dopant toward the bottom of the gate electrode 118 near gate dielectric 116, the implantation energy and the concentration of the boron fluoride ($BF_2$) dopant may be increased during the implantation process of FIG. 2. However, such an increase of the implantation energy increases the depth of the drain and source extension junctions 104 and 106 to disadvantageously increase short channel effects of the MOSFET 100. In addition, an increase of concentration of boron fluoride ($BF_2$) with the increase of fluorine concentration may corrode the gate dielectric 116.

Thus, a mechanism is desired for increasing the concentration of a P-type dopant near the gate dielectric of the PMOSFET to avoid formation of the depletion region near the gate dielectric while maintaining the drain and source extension junctions to be shallow for minimizing short channel effects.

SUMMARY OF THE INVENTION

Accordingly, in a general aspect of the present invention, an added implantation process is performed to implant a P-type dopant into a layer of gate electrode material before the gate electrode is patterned from the layer of gate electrode material and before the drain and source extension junctions are formed. In addition, a nitrided gate dielectric material is used to prevent diffusion of the P-type dopant out of the gate electrode material and into the gate dielectric material.

In one embodiment of the present invention, for fabricating a PMOS (P-channel Metal Oxide Semiconductor) field effect transistor on a semiconductor substrate, a layer of gate dielectric material is deposited on the semiconductor substrate, and the gate dielectric material contains nitrogen. A layer of gate electrode material is deposited on the layer of gate dielectric material. A first P-type dopant is implanted into a first region of the layer of gate electrode material disposed over a first active device area of the semiconductor substrate. The nitrogen within the gate dielectric material prevents diffusion of the first P-type dopant from the layer of gate electrode material into the layer of gate dielectric material.

The first region of the layer of gate electrode material is patterned to form a PMOS (P-channel Metal Oxide Semiconductor) gate electrode. The layer of gate dielectric material is patterned to form a PMOS (P-channel Metal Oxide Semiconductor) gate dielectric disposed under the PMOS gate electrode and disposed over the first active device area of the semiconductor substrate. Regions of the first active device area of the semiconductor substrate are exposed to sides of the PMOS gate electrode after formation of the PMOS gate dielectric and the PMOS gate electrode. A second P-type dopant is implanted into the PMOS gate electrode and into the exposed regions of the first active device area of the semiconductor substrate to form a drain extension junction and a source extension junction of the PMOS field effect transistor.

The present invention may be used to particular advantage when the gate electrode material is comprised of polysilicon or silicon germanium. In that case, the first P-type dopant implanted into the layer of gate electrode material is comprised of boron, and the second P-type dopant implanted for forming the drain and source extension junctions is comprised of boron fluoride ($BF_2$). The boron as the first P-type dopant is a lighter dopant than boron fluoride ($BF_2$) and thus distributes more evenly throughout the layer of gate electrode material. The nitrided gate dielectric material below the layer of gate electrode material prevents diffusion of the boron out of the gate electrode material and into the gate dielectric. Thus, a depletion region is less likely to form within the gate electrode near the gate dielectric.

Because the regions of the semiconductor substrate for forming the drain and source extension junctions are not exposed during the implantation of boron as the first P-type dopant, the boron dopant may be implanted with a higher implantation energy (higher than the implantation energy for implanting boron fluoride ($BF_2$)) such that the boron dopant extends down the gate electrode material near the gate dielectric to further avoid formation of the depletion region in the gate electrode near the gate dielectric. With such a higher implantation energy, the gate electrode having a larger height may be evenly doped with boron. A larger height of the gate electrode is desired for forming a thicker gate silicide with the gate electrode for minimizing resistance at the gate of the field effect transistor. In addition, because fluorine does not comprise the first type of dopant, a far relatively high concentration of the boron dopant may be implanted without corroding the gate dielectric to further minimize formation of the depletion region in the gate electrode near the gate dielectric. After patterning the gate electrode and the gate dielectric, boron fluoride ($BF_2$) as the second P-type dopant that is relatively heavier is used to form shallow drain and source extensions to minimize short channel effects of the PMOS field effect transistor.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and function.

DETAILED DESCRIPTION

Figure 1:
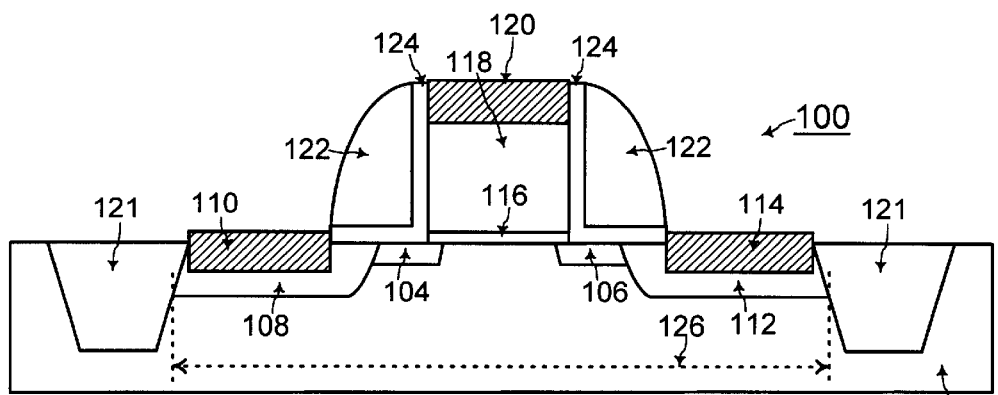
FIG. 1 shows a cross-sectional view of a conventional MOSFET (Metal Oxide Semiconductor Field Effect Transistor) formed within a semiconductor substrate.
Figure 2:
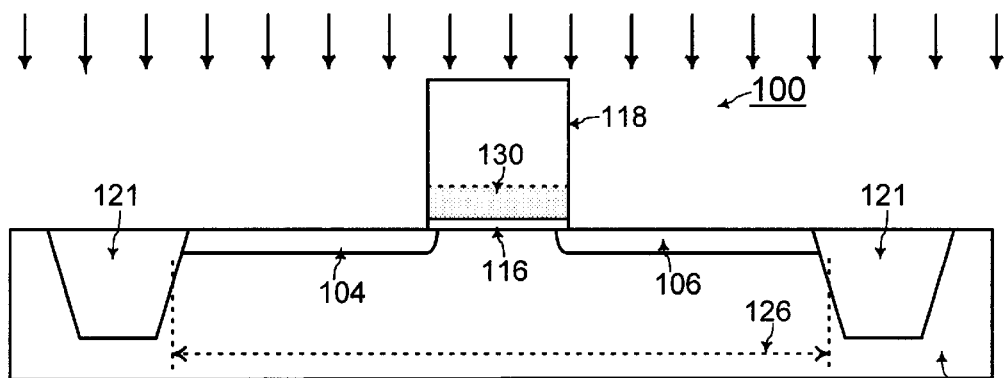
FIG. 2 shows a cross-sectional view of a conventional PMOSFET (P-channel Metal Oxide Semiconductor Field Effect Transistor) having a gate electrode that is doped with a P-type dopant during an implantation process for forming the shallow drain and source extension junctions, according to the prior art.
Figure 3:
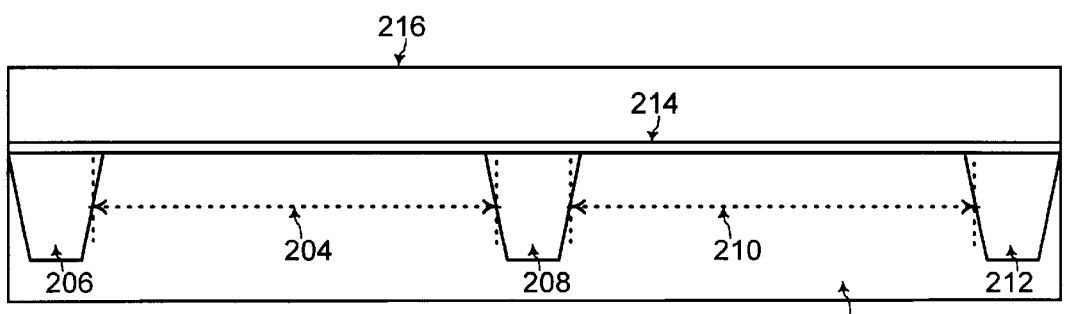
FIGS. 3, 4, 5, 6, and 7 show cross-sectional views for illustrating the steps for fabricating a PMOSFET (P-channel Metal Oxide Semiconductor Field Effect Transistor) with an added implantation of a P-type dopant into a first region of a layer of gate electrode material before the gate electrode is formed from the layer of gate electrode material and before the drain and source extension junctions are formed to avoid formation of a depletion region in the gate electrode, when the gate electrode material is comprised of polysilicon according to one embodiment of the present invention.

Referring to FIG. 3, a PMOSFET (P-channel Metal Oxide Semiconductor Field Effect Transistor) and an NMOSFET (N-channel Metal Oxide Semiconductor Field Effect Transistor) are formed on a semiconductor substrate 202 which is comprised of silicon in one embodiment of the present invention. A PMOSFET is to be formed on a first active device area 204 defined by a first shallow trench isolation structure 206 and a second shallow trench isolation structure 208. An NMOSFET is to be formed on a second active device area 210 defined by the second shallow trench isolation structure 208 and a third shallow trench isolation structure 212. Processes for formation of shallow trench isolation structures for electrically isolating integrated circuit devices within a semiconductor substrate are known to one of ordinary skill in the art of integrated circuit fabrication.

Further referring to FIG. 3, a layer of gate dielectric material 214 is formed on the semiconductor substrate 202. The layer of gate dielectric material 214 is comprised of nitrogen and is comprised of nitrided oxide ($N_2O$ or NO) according to one embodiment of the present invention. Processes, such as ONO deposition processes, for depositing such a layer of gate dielectric material 214 are known to one of ordinary skill in the art of integrated circuit fabrication. In an ONO deposition process, an oxygen source is initially turned on while the nitrogen source is turned off for forming a strong interface between the layer of gate dielectric material 214 and the semiconductor substrate 202, and then the nitrogen source is turned on while the oxygen source is turned off. Then, the nitrogen source is turned off and the oxygen source is turned on. Such an ONO deposition process is known to one of ordinary skill in the art of integrated circuit fabrication.

Referring to FIG. 3, a layer of gate electrode material 216 is deposited on the layer of gate dielectric material 214. In one embodiment of the present invention, the layer of gate electrode material 216 is comprised of polysilicon. Processes for depositing such a layer of gate electrode material 216 are known to one of ordinary skill in the art of integrated circuit fabrication.

Figure 4:
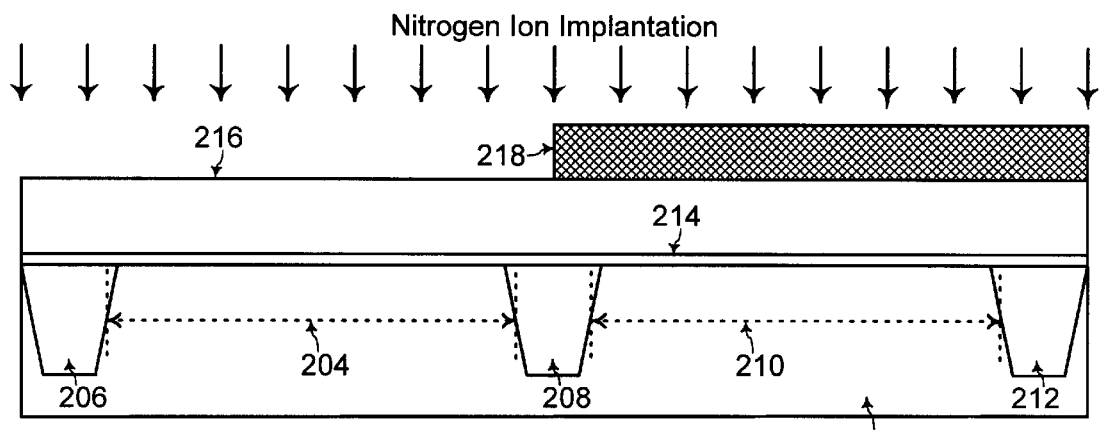

Referring to FIG. 4, a first region of the layer of gate electrode material 216 over the first active device area 204 of the semiconductor substrate 202 is exposed while a second region of the layer of gate electrode material 216 over the second active device area 210 of the semiconductor substrate 202 is covered with a masking structure 218. The masking structure 218 is comprised of photoresist according to one embodiment of the present invention, and processes for forming such a masking structure 218 are known to one of ordinary skill in the art of integrated circuit fabrication.

Further referring to FIG. 4, according to one embodiment of the present invention, nitrogen ion is implanted into the exposed first region of the layer of gate electrode material 216 over the first active device area 204 of the semiconductor substrate 202. The masking structure 218 blocks the nitrogen ion from being implanted into the second region of the layer of gate electrode material 216 over the second active device area 210 of the semiconductor substrate 202. The nitrogen ion is implanted to be toward the bottom of the layer of gate electrode material 216 near the layer of gate dielectric material 214. Implantation processes for implanting nitrogen ion are known to one of ordinary skill in the art of integrated circuit fabrication.

The implantation of the nitrogen ion increases the nitrogen concentration near the layer of gate dielectric material 214. However, the present invention may be practiced with or without this step of implantation of the nitrogen ion toward the bottom of the layer of gate electrode material 216 near the layer of gate dielectric material 214.

Figure 5:
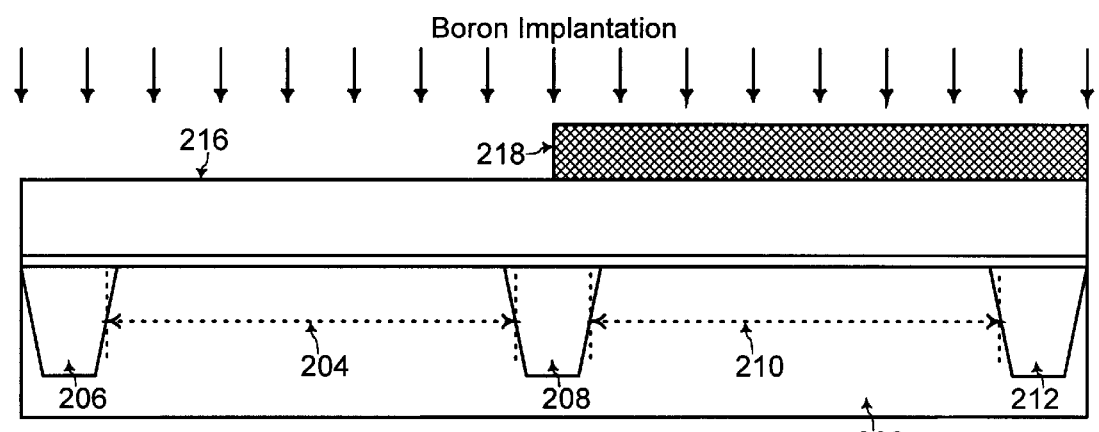

Referring to FIG. 5, a first P-type dopant is implanted into the exposed first region of the layer of gate electrode material 216 over the first active device area 204 of the semiconductor substrate 202. The first P-type dopant is boron according to one embodiment of the present invention. The masking structure 218 blocks the boron from being implanted into the second region of the layer of gate electrode material 216 over the second active device area 210 of the semiconductor substrate 202. Implantation processes for implanting boron are known to one of ordinary skill in the art of integrated circuit fabrication.

Figure 6:
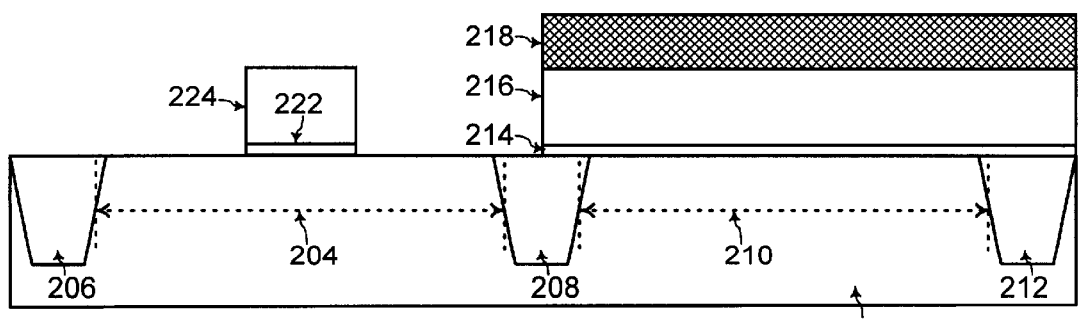

Referring to FIG. 6, the first region of the layer of gate electrode material 216 over the first active device area 204 of the semiconductor substrate 202 is patterned to form a PMOS (P-channel Metal Oxide Semiconductor) gate electrode 224 comprised of the gate electrode material 216. In addition, the layer of gate dielectric material 214 over the first active device area 204 of the semiconductor substrate 202 is patterned to form a PMOS (P-channel Metal Oxide Semiconductor) gate dielectric 222 comprised of the gate dielectric material 214 disposed under the PMOS gate electrode 224. Processes for patterning the layer of gate electrode material 216 which may be comprised of polysilicon and the layer of gate dielectric material 214 which may be comprised of nitrided oxide are known to one of ordinary skill in the art of integrated circuit fabrication.

Figure 7:
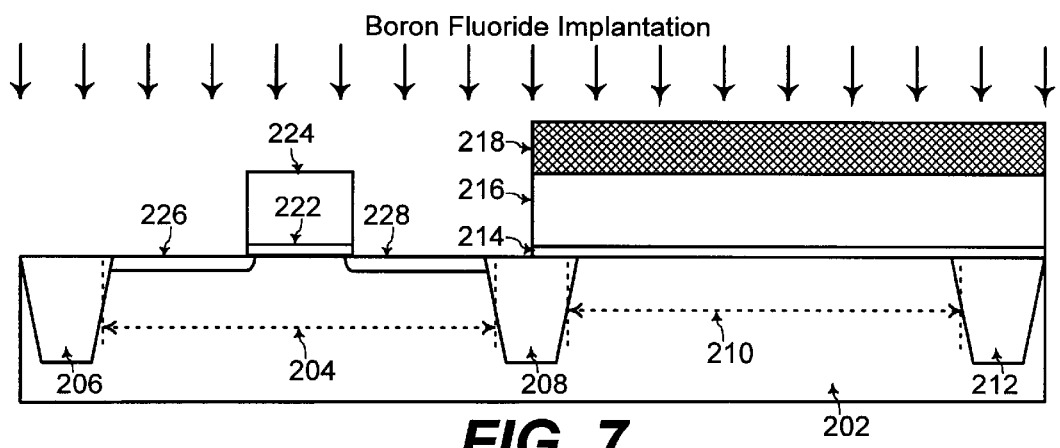

With formation of the PMOS gate dielectric 222 and the PMOS gate electrode 224, regions of the first active device area 204 of the semiconductor substrate 202 are exposed to the sides of the PMOS gate electrode 224. Referring to FIG. 7, a second P-type dopant is implanted into the PMOS gate electrode 224 and into the exposed regions of the first active device area 204 of the semiconductor substrate 202 to form a drain extension junction 226 and a source extension junction 228 of the PMOSFET. The second P-type dopant for forming the drain and source extension junctions 226 and 228 is boron fluoride ($BF_2$) according to one embodiment of the present invention. Boron fluoride ($BF_2$) is a relatively heavy dopant (heavier than boron) such that the drain and source extension junctions 226 and 228 are shallow junctions for minimizing short channel effects of the PMOSFET.

On the other hand, referring to FIG. 5, boron as the first P-type dopant implanted into the layer of gate electrode material 216 before patterning of the PMOS gate electrode 224 is a lighter dopant than boron fluoride ($BF_2$) and thus distributes more evenly throughout the layer of gate electrode material 216. Thus, boron as this first P-type dopant is more likely to reach down to the bottom of the PMOS gate electrode 224 to minimize formation of a depletion region near the PMOS gate dielectric 222.

In addition, the nitrided gate dielectric material 214 below the layer of gate electrode material 216 prevents diffusion of boron out of the gate electrode material 216 and into the gate dielectric 214. Thus, a depletion region is less likely to form within the PMOS gate electrode 224 near such a PMOS gate dielectric 222. The implantation of nitrogen ion to be toward the bottom of the gate electrode material 216 near the gate dielectric material 214 in FIG. 4 further prevents diffusion of boron out of the gate electrode material 216 and into the gate dielectric material 214.

Furthermore, because the regions of the semiconductor substrate for forming the drain and source extension junctions 226 and 228 are not exposed during the implantation of boron as the first P-type dopant, the boron dopant may be implanted with a higher implantation energy (higher than the implantation energy for implanting boron fluoride ($BF_2$)) such that the boron dopant extends down the gate electrode material 216 near the gate dielectric material 214 to further avoid formation of the depletion region in the PMOS gate electrode 224 near the PMOS gate dielectric 222. With such a higher implantation energy, the PMOS gate electrode 224 having a larger height may be evenly doped with boron. A larger height of the PMOS gate electrode 224 is desired for forming a thicker gate silicide with the PMOS gate electrode 224 for minimizing resistance at the gate of the PMOSFET. In addition, because fluorine does not comprise the first type of dopant, a relatively high concentration of the boron dopant may be implanted without corroding the PMOS gate dielectric 222 to further minimize formation of the depletion region in the PMOS gate electrode 224 near the PMOS gate dielectric 222.

Figure 8:
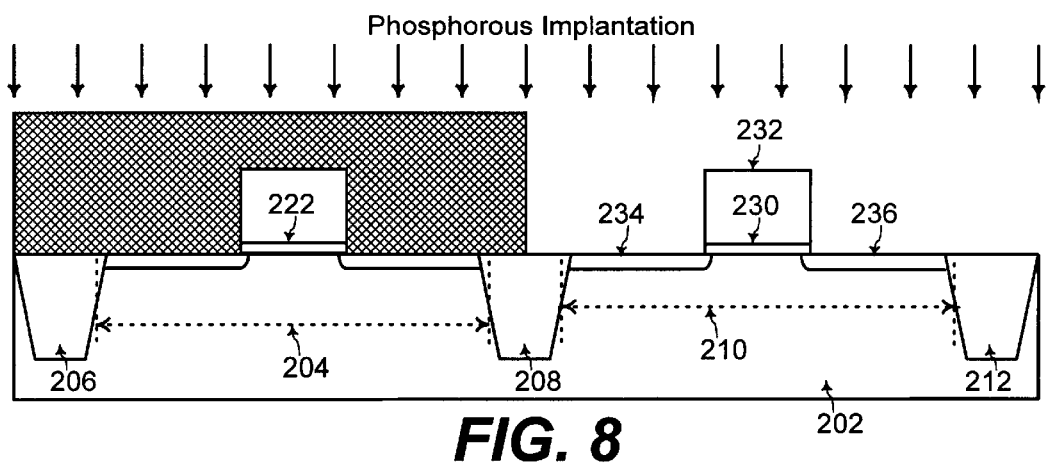
FIG. 8 shows the cross-sectional view for illustrating the step for fabricating an NMOSFET (N-channel Metal Oxide Semiconductor Field Effect Transistor) with a gate electrode formed from a second region of the layer of gate electrode material of FIG. 7, according to one embodiment of the present invention.

Referring to FIG. 8, the masking structure 218 is etched away, and an NMOS (N-channel Metal Oxide Semiconductor) gate electrode 232 is formed from the layer of gate electrode material 216 over the second active device area 210 of the semiconductor substrate 202. An NMOS (N-channel Metal Oxide Semiconductor) gate dielectric 230 is formed from the layer of gate dielectric material 214 over the second active device area 210 of the semiconductor substrate 202. The NMOS gate dielectric 230 is disposed under the NMOS gate electrode 232. An N-type dopant such as phosphorous is implanted into exposed regions of the second active device area 210 of the semiconductor substrate 202 to form a drain extension junction 234 and a source extension junction 236 of an NMOSFET (N-channel Metal Oxide Semiconductor Field Effect Transistor). Processes for forming such structures of the NMOSFET are known to one of ordinary skill in the art of integrated circuit fabrication.

Figure 9:
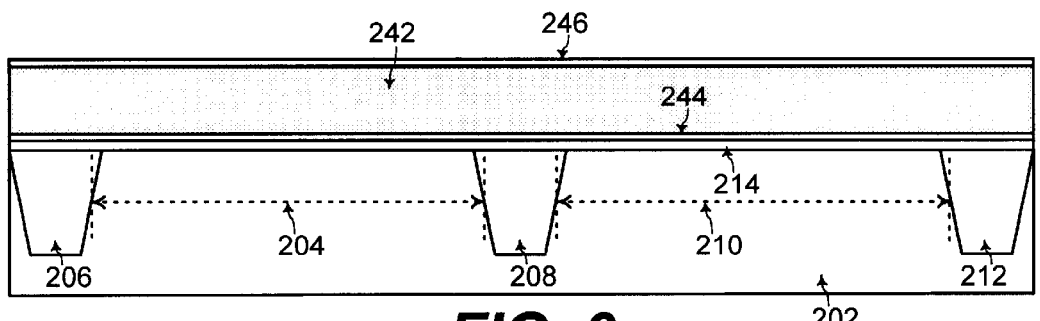
FIGS. 9, 10, and 11 show cross-sectional views for illustrating the steps for fabricating a PMOSFET (P-channel Metal Oxide Semiconductor Field Effect Transistor) with an added implantation of a P-type dopant into a first region of a layer of gate electrode material before the gate electrode is formed from the layer of gate electrode material and before the drain and source extension junctions are formed to avoid formation of a depletion region in the gate electrode, when the gate electrode material is comprised of silicon germanium according to another embodiment of the present invention.

FIGS. 3, 4, 5, 6, 7, and 8 have the layer of gate electrode material 216 being comprised of polysilicon according to one embodiment of the present invention. Referring to FIG. 9, according to another embodiment of the present invention, a layer of gate electrode material 242 that is comprised of silicon germanium (SiGe) is deposited on the layer of gate dielectric material 214. A buffer layer of polysilicon is formed 244 between the semiconductor substrate 202 and the layer of silicon germanium 242 to provide a smooth transition between the semiconductor substrate 202 and the layer of silicon germanium 242. In addition, a capping layer of polysilicon 246 is formed on the layer of silicon germanium 242 to prevent diffusion of germanium out of the layer of silicon germanium 242. Processes for depositing the buffer layer of polysilicon 244, the layer of silicon germanium 242, and the capping layer of polysilicon 246 are known to one of ordinary skill in the art of integrated circuit fabrication.

Figure 10:
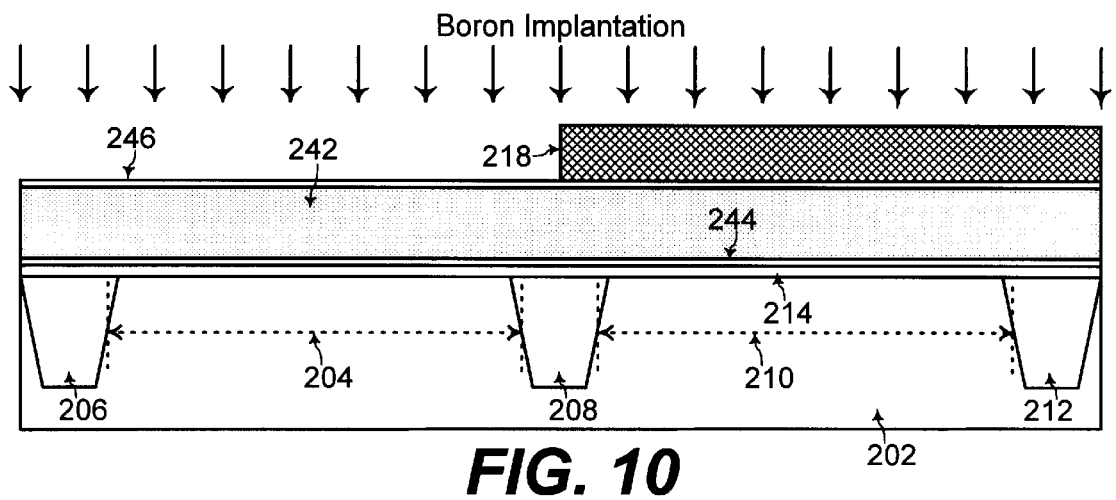

Referring to FIG. 10, a first P-type dopant is implanted into the exposed first region of the layer of gate electrode material 242 over the first active device area 204 of the semiconductor substrate 202. The first P-type dopant is boron according to one embodiment of the present invention. The masking structure 218 blocks the boron from being implanted into the second region of the layer of gate electrode material 242 over the second active device area 210 of the semiconductor substrate 202. Implantation processes for implanting boron are known to one of ordinary skill in the art of integrated circuit fabrication.

Figure 11:
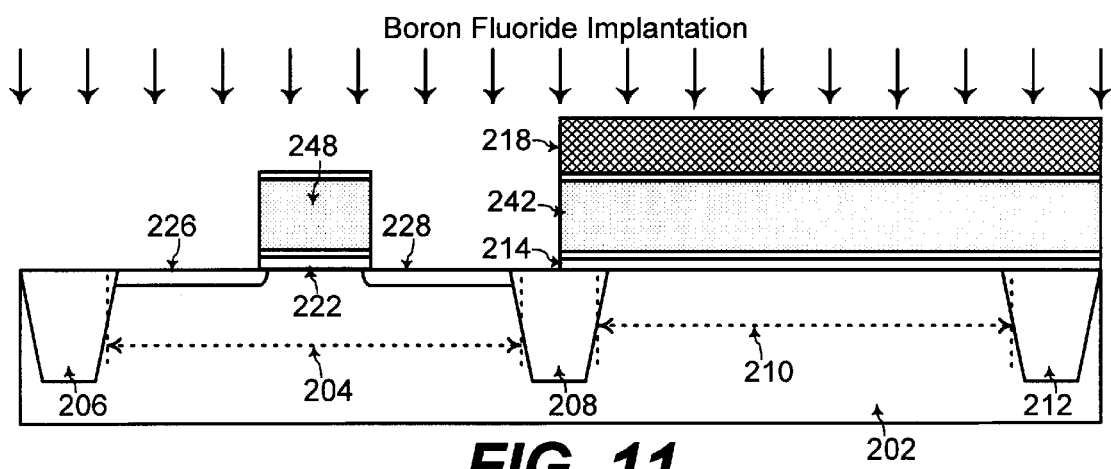

Referring to FIG. 11, the first region of the layer of silicon germanium 242 (with the buffer layer of polysilicon 244 and the capping layer of polysilicon 246) over the first active device area 204 of the semiconductor substrate 202 is patterned to form the PMOS gate electrode 248 disposed over the PMOS gate dielectric 222. Processes for patterning the layer of silicon germanium 242, the buffer layer of polysilicon 244, and the capping layer of polysilicon 246 are known to one of ordinary skill in the art of integrated circuit fabrication.

Further referring to FIG. 11, with formation of the PMOS gate dielectric 222 and the PMOS gate electrode 248 comprised of silicon germanium, regions of the first active device area 204 of the semiconductor substrate 202 are exposed to the sides of the PMOS gate electrode 248. Referring to FIG. 11, a second P-type dopant is implanted into the PMOS gate electrode 248 and into the exposed regions of the first active device area 204 of the semiconductor substrate 202 to form a drain extension junction 226 and a source extension junction 228 of the PMOSFET. The second P-type dopant for forming the drain and source extension junctions 226 and 228 is boron fluoride ($BF_2$) according to one embodiment of the present invention. Boron fluoride ($BF_2$) is a relatively heavy dopant (heavier than boron) such that the drain and source extension junctions 226 and 228 are shallow junctions for minimizing short channel effects of the PMOSFET.

On the other hand, referring to FIG. 10, the boron as the first P-type dopant implanted into the layer of gate electrode material 242 before patterning of the PMOS gate electrode 248 is a lighter dopant than boron fluoride ($BF_2$) and thus distributes more evenly throughout the layer of gate electrode material 242. Thus, boron as this first P-type dopant is more likely to reach down to the bottom of the PMOS gate electrode 248 to minimize formation of a depletion region near the PMOS gate dielectric 222.

In addition, the nitrided gate dielectric material 214 below the layer of gate electrode material 242 prevents diffusion of the boron out of the gate electrode material 242 and into the gate dielectric material 214. Thus, a depletion region is less likely to form within the PMOS gate electrode 248 near the PMOS gate dielectric 222.

Furthermore, because the regions of the semiconductor substrate for forming the drain and source extension junctions 226 and 228 are not exposed during the implantation of boron as the first P-type dopant, the boron dopant may be implanted with a higher implantation energy (higher than the implantation energy for implanting boron fluoride ($BF_2$)) such that the boron dopant extends down the gate electrode material 242 near the gate dielectric material 214 to further avoid formation of the depletion region in the PMOS gate electrode 248 near the PMOS gate dielectric 222. With such a higher implantation energy, the PMOS gate electrode 248 having a larger height may be evenly doped with boron. A larger height of the PMOS gate electrode 248 is desired for forming thicker gate silicide with the PMOS gate electrode 248 for minimizing resistance at the gate of the PMOSFET. In addition, because fluorine does not comprise the first type of dopant, a relatively high concentration of the boron dopant may be implanted without corroding the PMOS gate dielectric 222 to further minimize formation of the depletion region in the PMOS gate electrode 248 near the PMOS gate dielectric 222.

Silicon germanium is advantageously used as the gate electrode material according to one embodiment of the present invention because dopant is activated at a lower temperature within silicon germanium than in polysilicon. With lower temperature for activating dopant within the PMOS gate electrode 248 comprised of silicon germanium, thermal diffusion of dopant within the drain and source extension junctions 226 and 228 is minimized to maintain the drain and source extension junctions 226 and 228 to be shallow junctions.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "side" and "on" as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:

1. A method for fabricating a PMOS (P-channel Metal Oxide Semiconductor) field effect transistor on a semiconductor substrate, the method including the steps of:

A. depositing a layer of gate dielectric material on said semiconductor substrate, wherein said gate dielectric material contains nitrogen;

B. depositing a layer of gate electrode material on said layer of gate dielectric material;

C. implanting a first P-type dopant into a first region of said layer of gate electrode material disposed over a first active device area of said semiconductor substrate;
wherein said nitrogen within said gate dielectric material prevents diffusion of said first P-type dopant from said layer of gate electrode material into said layer of gate dielectric material;

D. patterning said first region of said layer of gate electrode material to form a PMOS (P-channel Metal Oxide Semiconductor) gate electrode;
wherein said step C of implanting said first P-type dopant into said layer of gate electrode material is performed before said step D of patterning said PMOS gate electrode such that said first P-type dopant is not implanted into said semiconductor substrate;

E. patterning said layer of gate dielectric material to form a PMOS (P-channel Metal Oxide Semiconductor) gate dielectric disposed under said PMOS gate electrode and disposed over said first active device area of said semiconductor substrate;
wherein regions of said first active device area of said semiconductor substrate are exposed to sides of said PMOS gate electrode; and F. implanting a second P-type dopant into said PMOS gate electrode and into said exposed regions of said first active device area of said semiconductor substrate to form a drain extension junction and a source extension junction of said PMOS field effect transistor.

2. The method of claim 1, wherein an NMOS (N-channel Metal Oxide Semiconductor) field effect transistor is fabricated with an NMOS (N-channel Metal Oxide Semiconductor) gate formed from a second region of said layer of gate electrode material doped with an N-type dopant over a second active device area of said semiconductor substrate.

3. The method of claim 1, wherein said layer of gate electrode material is comprised of polysilicon.

4. The method of claim 1, wherein said layer of gate electrode material is comprised of silicon germanium (SiGe).

5. A method for fabricating a PMOS (P-channel Metal Oxide Semiconductor) field effect transistor on a semiconductor substrate, the method including the steps of:

A. depositing a layer of gate dielectric material on said semiconductor substrate, wherein said gate dielectric material contains nitrogen;

B. depositing a layer of gate electrode material on said layer of gate dielectric material;

C. implanting a first P-type dopant into a first region of said layer of gate electrode material disposed over a first active device area of said semiconductor substrate;
wherein said nitrogen within said gate dielectric material prevents diffusion of said first P-type dopant from said layer of gate electrode material into said layer of gate dielectric material;

D. patterning said first region of said layer of gate electrode material to form a PMOS (P-channel Metal Oxide Semiconductor) gate electrode;

E. patterning said layer of gate dielectric material to form a PMOS (P-channel Metal Oxide Semiconductor) gate dielectric disposed under said PMOS gate electrode and disposed over said first active device area of said semiconductor substrate;
wherein regions of said first active device area of said semiconductor substrate are exposed to sides of said PMOS gate electrode; and F. implanting a second P-type dopant into said PMOS gate electrode and into said exposed regions of said first active device area of said semiconductor substrate to form a drain extension junction and a source extension junction of said PMOS field effect transistor;
wherein said layer of gate electrode material is comprised of silicon germanium (SiGe);
and wherein said layer of gate electrode material is further comprised of a buffer layer of polysilicon disposed between said semiconductor substrate and said silicon germanium (SiGe) of said layer of gate electrode material, and is further comprised of a capping layer of polysilicon disposed on top of said silicon germanium (SiGe) of said layer of gate electrode material.

6. The method of claim 1, wherein said first P-type dopant implanted into said first region of said layer of gate electrode material in said step C is boron (B).

7. The method of claim 1, wherein said second P-type dopant implanted into said PMOS gate electrode and said exposed regions of said first active device area of said semiconductor substrate to form said drain and source extension junctions in said step F is boron fluoride ($BF_2$).

8. The method of claim 1, wherein said layer of gate dielectric material is comprised of nitrided oxide ($N_2O$ or NO).

9. The method of claim 8, wherein said nitrided oxide is formed in an ONO (oxygen-nitrogen-oxygen) deposition process.

10. The method of claim 1, further including the step of.
implanting nitrogen ions through said layer of gate electrode material to be substantially near said layer of gate dielectric material, before said step C, and before said step D of patterning said PMOS gate electrode such that said nitrogen ions are not implanted into said semiconductor substrate.

11. A method for fabricating a PMOS (P-channel Metal Oxide Semiconductor) field effect transistor on a semiconductor substrate, the method including the sequential steps of:

A. depositing a layer of gate dielectric material on said semiconductor substrate, wherein said layer of gate dielectric material is comprised of nitrided oxide ($N_2O$ or NO) formed in an ONO (oxygen-nitrogen-oxygen) deposition process;

B. depositing a layer of gate electrode material on said layer of gate dielectric material;

wherein said layer of gate electrode material is comprised of silicon germanium (SiGe), a buffer layer of polysilicon disposed between said semiconductor substrate and said silicon germanium (SiGe), and a capping layer of polysilicon disposed on top of said silicon germanium (SiGe);

C. implanting nitrogen ions through said layer of gate electrode material to be substantially near said layer of gate dielectric material;

D. implanting a first P-type dopant into a first region of said layer of gate electrode material disposed over a first active device area of said semiconductor substrate, wherein said first P-type dopant implanted into said first region of said layer of gate electrode material is boron (B);

and wherein said nitrogen within said gate dielectric material prevents diffusion of said first P-type dopant from said layer of gate electrode material into said layer of gate dielectric material;

E. patterning said first region of said layer of gate electrode material to form a PMOS (P-channel Metal Oxide Semiconductor) gate electrode;

F. patterning said layer of gate dielectric material to form a PMOS (P-channel Metal Oxide Semiconductor) gate dielectric disposed under said PMOS gate electrode and disposed over said first active device area of said semiconductor substrate;

wherein regions of said first active device area of said semiconductor substrate are exposed to sides of said PMOS gate electrode;

G. implanting a second P-type dopant into said PMOS gate electrode and into said exposed regions of said first active device area of said semiconductor substrate to form a drain extension junction and a source extension junction of said PMOS field effect transistor, wherein said second P-type dopant is boron fluoride ($BF_2$); and H. forming an NMOS (N-channel Metal Oxide Semiconductor) field effect transistor with an NMOS (N-channel Metal Oxide Semiconductor) gate patterned from a second region of said layer of gate electrode material doped with an N-type dopant over a second active device area of said semiconductor substrate.

12. The method of claim 5, wherein an NMOS (N-channel Metal Oxide Semiconductor) field effect transistor is fabricated with an NMOS (N-channel Metal Oxide Semiconductor) gate formed from a second region of said layer of gate electrode material doped with an N-type dopant over a second active device area of said semiconductor substrate.

13. The method of claim 5, wherein said layer of gate electrode material is comprised of polysilicon.

14. The method of claim 5, wherein said first P-type dopant implanted into said first region of said layer of gate electrode material in said step C is boron (B).

15. The method of claim 5, wherein said second P-type dopant implanted into said PMOS gate electrode and said exposed regions of said first active device area of said semiconductor substrate to form said drain and source extension junctions in said step F is boron fluoride ($BF_2$).

16. The method of claim 5, wherein said layer of gate dielectric material is comprised of nitrided oxide ($N_2O$ or NO).

17. The method of claim 16, wherein said nitrided oxide is formed in an ONO (oxygen-nitrogen-oxygen) deposition process.

18. The method of claim 5, further including the step of:

implanting nitrogen ions through said layer of gate electrode material to be substantially near said layer of gate dielectric material, before said step C.

* * * * *